United States Patent
Chan et al.

(10) Patent No.: US 9,475,701 B2
(45) Date of Patent: Oct. 25, 2016

(54) QUINONE RADICALS FOR ENRICHING SPECIFIC SPECIES OF CARBON NANOTUBES

(71) Applicant: Nanyang Technological University, Singapore (SG)

(72) Inventors: Bee Eng Mary Chan, Singapore (SG); Zhi Dai, Singapore (SG); Yu Qian Tina Tan, Singapore (SG); Liangyu Yan, Singapore (SG)

(73) Assignee: Nanyang Technological University, Singapore (SG)

(*) Notice: Subject to any disclaimer, the term of this patent is extended or adjusted under 35 U.S.C. 154(b) by 165 days.

(21) Appl. No.: 13/894,205

(22) Filed: May 14, 2013

(65) Prior Publication Data

US 2013/0336874 A1    Dec. 19, 2013

Related U.S. Application Data

(63) Continuation of application No. 13/807,472, filed as application No. PCT/IB2011/001529 on Jun. 30, 2011, now abandoned.

(60) Provisional application No. 61/360,162, filed on Jun. 30, 2010.

(51) Int. Cl.
| | |
|---|---|
| *C01B 31/02* | (2006.01) |
| *B82Y 10/00* | (2011.01) |
| *B82Y 30/00* | (2011.01) |
| *B82Y 40/00* | (2011.01) |
| *H01L 51/00* | (2006.01) |
| *H01L 51/05* | (2006.01) |

(52) U.S. Cl.
CPC .............. *C01B 31/026* (2013.01); *B82Y 10/00* (2013.01); *B82Y 30/00* (2013.01); *B82Y 40/00* (2013.01); *C01B 31/0273* (2013.01); *H01L 51/0049* (2013.01); *H01L 51/0558* (2013.01)

(58) Field of Classification Search
CPC ....... B82Y 10/00; B82Y 30/00; B82Y 40/00; C01B 31/0273; C01B 31/026; H01L 51/0049; H01L 51/0558
USPC ........ 423/447.1–447.3, 445 B; 977/742–754, 977/842–848
See application file for complete search history.

(56) References Cited

U.S. PATENT DOCUMENTS 7,514,063 B1    4/2009  Tulevski et al.

FOREIGN PATENT DOCUMENTS

WO    2008/057108    * 5/2008 .............. C01B 31/02

OTHER PUBLICATIONS

O'Connell, et al., Chiral selectivity in the charge-transfer bleaching of single-walled carbon-nanotube spectra, Nature Materials 2005; 4: 412-418.*
Arnold et al., "Sorting carbon nanotubes by electronic structure using density differentiation," Nature Nanotechnology 1: 60-65, 2006.
Bachilo et al., "Structure-Assigned Optical Spectra of Single-Walled Carbon Nanotubes," Science 298: 2361-2366, 2002.
Baughman et al., "Carbon Nanotubes—the Route Toward Applications," Science 297: 787-792, 2002.
Cao et al., "Medium-scale carbon nanotube thin-film integrated circuits on flexible plastic substrates," Nature 454: 495-502, 2008.
Chen et al., "Toward the Extraction of Single Species of Single-Walled Carbon Nanotubes Using Fluorene-Based Polymers," Nano Letters 7(10): 3013-3017, 2007.
Collins et al., "Engineering Carbon Nanotubes and Nanotube Circuits Using Electrical Breakdown," Science 292: 706-709, 2001.
Engel et al., "Thin Film Nanotube Transistors Based on Self-Assembled, Aligned, Semiconducting Carbon Nanotube Arrays," ACS Nano 2(12): 2445-2452, 2008.
Hersam, "Progress towards monodisperse single-walled carbon nanotubes," Nature Nanotechnology 3: 387-394, 2008.
Hu et al., "Percolation in Transparent and Conducting Carbon Nanotube Networks," Nano Letters 4(12): 2513-2517, 2004.
Jorio et al., "Quantifying carbon-nanotube species with resonance Raman scattering," Physical Review B 72: 075207-1-075207-5, 2005.
Kanungo et al., "Suppression of Metallic Conductivity of Single-Walled Carbon Nanotubes by Cycloaddition Reactions," Science 323: 234-237, 2009.
Kresse et al., "Efficient iterative schemes for ab initio total-energy calculations using a plane-wave basis set," Physical Review B 54(16): 11 169-11 186, 1996.
Krupke et al., "Separation of Metallic from Semiconducting Single-Walled Carbon Nanotubes," Science 301: 344-347, 2003.
Krupke et al., "Simultaneous Deposition of Metallic Bundles of Single-walled Carbon Nanotubes Using Ac-dielectrophoresis," Nano Letters 3(8): 1019-1023, 2003.
Krupke et al., "Thin Films of Metallic Carbon Nanotubes Prepared by Dielectrophoresis," Adv. Mater. 18: 1468-1470, 2006.
Lee et al., "Solution-Processable Carbon Nanotubes for Semiconducting Thin-Film Transistor Devices," Adv. Mater. 22: 1278-1282, 2010.
Li et al., "Selective Interactions of Porphyrins with Semiconducting Single-Walled Carbon Nanotubes," J. Am. Chem. Soc. 126: 1014-1015, 2004.
Lu et al., "Selective Interaction of Large or Charge-Transfer Aromatic Molecules with Metallic Single-Wall Carbon Nanotubes: Critical Role of the Molecular Size and Orientation," J. Am. Chem. Soc. 128: 5114-5118, 2006.
Maeda et al., "Large-Scale Separation of Metallic and Semiconducting Single-Walled Carbon Nanotubes," J. Am. Chem. Soc. 127: 10287-10290, 2005.

(Continued)

Primary Examiner — Daniel C McCracken
(74) Attorney, Agent, or Firm — Seed IP Law Group PLLC

(57) ABSTRACT

The present invention is directed to a method for enriching specific species of carbon nanotubes, comprising contacting a composition of carbon nanotubes with one or more quinone compounds, reacting the carbon nanotubes with the quinone compounds, and separating the carbon nanotubes reacted with the quinone compounds from the unreacted carbon nanotubes. The present invention is also directed to a field-effect transistor comprising a semiconducting single-walled carbon nanotube enriched using a method described herein.

20 Claims, 10 Drawing Sheets

(56) References Cited

OTHER PUBLICATIONS

Maeda et al., "Dispersion and Separation of Small-Diameter Single-Walled Carbon Nanotubes," *J. Am. Chem. Soc. 128*: 12239-12242, 2006.

Miyata et al., "Selective Oxidation of Semiconducting Single-Wall Carbon Nanotubes by Hydrogen Peroxide," *The Journal of Physical Chemistry Letters B 110*: 25-29, 2006.

Naumov et al., "Quantifying the Semiconducting Fraction in Single-Walled Carbon Nanotube Samples through Comparative Atomic Force and Photoluminescence Microscopies," *Nano Letters 9*(9): 3203-3208, 2009.

Nish et al., "Highly selective dispersion of single-walled carbon nanotubes using aromatic polymers," *Nature Nanotechnology 2*:640-646, 2007.

Peng et al., "Improved Optical Enrichment of SWNTs through Extraction with Chiral Nanotweezers of 2,6-Pyridylene-Bridged Diporphyrins," *J. Am. Chem. Soc. 129*: 15947-15953, 2007.

Perdew et al., "Generalized Gradient Approximation Made Simple," *Physical Review Letters 77*(18): 3865-3868, 1996.

Sangermano et al., "Visible and Long-Wavelength Cationic Photopolymerization," in Photoinitiated Polymerization, ACS Symposium Series, pp. 242-252, 2003.

Snow et al., "Random networks of carbon nanotubes as an electrical material," *Applied Physics Letters 82*(13): 2145-2147, 2003.

Strano et al., "Electronic Structure Control of Single-Walled Carbon Nanotube Functionalization," *Science 301*: 1519-1522, 2003.

Tanaka et al., "Simple and Scalable Gel-Based Separation of Metallic and Semiconducting Carbon Nanotubes," *Nano Letters 9*(4): 1497-1500, 2009.

Tans et al., "Room-temperature transistor based on a single carbon nanotube," *Nature 393*: 49-52, 1998.

Wang et al., "Metallic Single-Walled Carbon Nanotubes for Conductive Nanocomposites," *J. Am. Chem. Soc. 130*: 1415-1419, 2008.

Woods et al., "Adsorption of simple benzene derivatives on carbon nanotubes," *Physical Review B 75*: 155415-1-155415-9, 2007.

Zhang et al., "Self-Aligned Ballistic n-Type Single-Walled Carbon Nanotube Field-Effect Transistors with Adjustable Threshold Voltage," *Nano Letters 8*(11): 3696-3701, 2008.

Zheng et al., "DNA-assisted dispersion and separation of carbon nanotubes," *Nature Materials 2*: 338-342, 2003.

Zheng et al., "Solution Redox Chemistry of Carbon Nanotubes," *J. Am. Chem. Soc. 126*: 15490-15494, 2004.

\* cited by examiner

US 9,475,701 B2

QUINONE RADICALS FOR ENRICHING SPECIFIC SPECIES OF CARBON NANOTUBES

CROSS-REFERENCE TO RELATED APPLICATION

This application makes reference to and claims the benefit of priority of an application for "Selective small-diameter metallic single-walled carbon nanotubes removal by mere standing with anthraquinone and application to field-effect transistor" filed on Jun. 30, 2010 with the United States Patent and Trademark Office, and there duly assigned Ser. No. 61/360,162. The content of said application filed on Jun. 30, 2010 is incorporated herein by reference for all purposes, including an incorporation of any element or part of the description, claims or drawings not contained herein and referred to in Rule 20.5(a) of the PCT, pursuant to Rule 4.18 of the PCT.

TECHNICAL FIELD

Various embodiments relate to the field of nanomaterials, such as carbon nanotubes, in particular chemical methods using quinone radicals for enriching different species of carbon nanotubes.

BACKGROUND

As-synthesized single-walled carbon nanotubes (SWNTs) contain mixtures of metallic and semiconducting species with different diameters and chiral angles. Semiconducting SWNTs are known to exhibit superior field-effect behavior. To minimize the effect of tube-to-tube variation on device electronic properties, networks of SWNTs, rather than individual nanotubes, have been applied in producing field effect transistors (FETs). FETs employing SWNT networks (SWNTnets) in the active channels are quite reproducible and printable, making low-cost macro-electronics possible. SWNTnet-based FETs have achieved mobilities higher than those typically achieved with semiconducting polymers. However, the presence of metallic tubes in SWNTnets impairs or destroys the switching behavior of semiconducting tubes. There exist numerous approaches to separate semiconducting SWNTs from metallic SWNTs. These strategies include the synthetic strategy of selective growth, post-synthesis solution-based separation methods (such as electrophoretic separation, dielectrophoresis, chromatography, density gradient ultracentrifugation (DGU), gel-based separation techniques, selective aromatic extraction, surfactant extraction, amine extraction, surface alignment and selective polymer wrapping) and fabrication-based techniques such as electrical breakdown of metallic nanotubes. However, many of the proposed methods do not achieve full semiconductor device yield, or do involve substantial costs.

Selective functionalizations of SWNTs using small aromatic molecules which can strongly interact with SWNTs via π-π stacking interaction, have been used for selective separation of SWNTs. Such molecules include diazonium salts, pyrene derivatives, porphyrine derivatives, pentacene derivatives and flavin mononucleotide. However, most separation techniques are still insufficient to remove metallic SWNTs to an extent sufficient to meet the requirements for electronic devices.

Thus it is an object of the present invention to provide alternative methods for enriching specific species of SWNTs.

SUMMARY

In a first aspect, the present invention relates to a method for enriching specific species of carbon nanotubes, comprising: contacting a composition of carbon nanotubes with one or more quinone compounds; reacting the carbon nanotubes with the quinone compounds; and separating the carbon nanotubes reacted with the quinone compounds from the unreacted carbon nanotubes, wherein the one or more quinone compounds are of Formula (I):

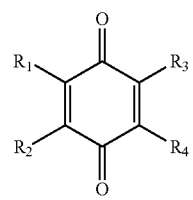

wherein $R_1$, $R_2$, $R_3$, and $R_4$ are each independently selected from the group consisting of H, halogen, —CN, —OR, —N$_3$, —C(O)OR, —C(O)R, —C(O)NRR', —NRC(O)R, —NRR', —SOR, —SO$_2$R, —NO$_2$, a substituted or unsubstituted $C_{1-6}$ alkyl group, a substituted or unsubstituted $C_{2-6}$ alkenyl group, and a substituted or unsubstituted $C_{2-6}$ alkynyl group, or $R_1$ and $R_2$, and/or $R_3$ and $R_4$ combine to form a substituted or unsubstituted ring, wherein R and R' are each independently selected from the group consisting of H and $C_{1-6}$ alkyl; provided that the compound is not 2,3-dichloro-5,6-dicyano-1,4,-benzoquinone or tetrachlorobenzoquinone.

In a second aspect, the present invention relates to a field-effect transistor comprising a semiconducting single-walled carbon nanotube enriched using a method of the invention.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1A:
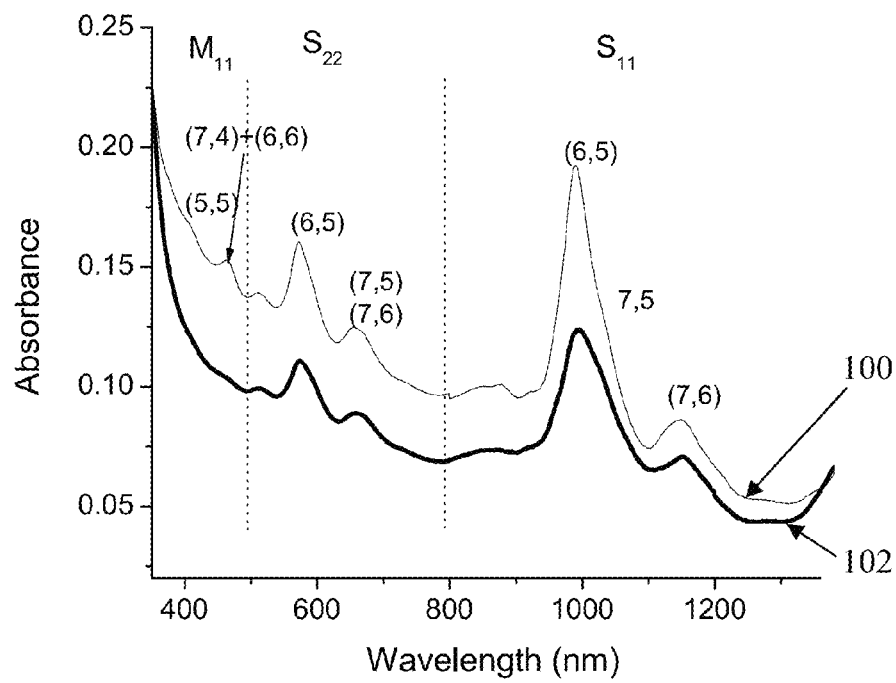
FIGS. 1(a), 1(b) and 1(c) show optical absorption spectra, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

In order that the invention may be readily understood and put into practical effect, particular embodiments will now be described by way of examples and not limitations, and with reference to the figures.

Various embodiments provide a simple method for obtaining semiconducting single-walled carbon nanotubes (SWNTs) enriched samples by using a quinone compound, for example, 2-ethylanthraquinone (EAQ). In this simple enrichment method, the separation is performed by the selective adsorption of metallic and smaller diameter SWNTs on the quinone compounds. More specifically, the quinone compounds decompose into radicals, which preferentially adsorb to SWNTs having smaller diameter, particularly metallic SWNTs; thereby selectively removing them. The method is rapid and scalable, and widely applicable for obtaining semiconducting tubes for printed electronic devices. Devices made with quinone compound-separated SWNTs exhibit greatly improved on/off ratios, for example, ~2 orders of magnitude higher than that of thin film transistors made with pristine SWNTs.

In a first aspect, the present invention relates to a method for enriching specific species of carbon nanotubes comprising:

contacting a composition of carbon nanotubes with one or more quinone compounds;

reacting the carbon nanotubes with the quinone compounds; and separating the carbon nanotubes reacted with the quinone compounds from the unreacted carbon nanotubes, wherein the one or more quinone compounds are of Formula (I):

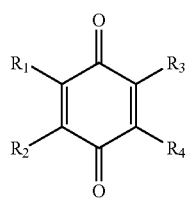

(I)

wherein $R_1$, $R_2$, $R_3$, and $R_4$ are each independently selected from the group consisting of H, halogen, —CN, —OR, —$N_3$, —C(O)OR, —C(O)R, —C(O)NRR', —NRC(O)R, —NRR', —SOR, —$SO_2$R, —$NO_2$, a substituted or unsubstituted $C_{1-6}$ alkyl group, a substituted or unsubstituted $C_{2-6}$ alkenyl group, and a substituted or unsubstituted $C_{2-6}$ alkynyl group, or $R_1$ and $R_2$, and/or $R_3$ and $R_4$ combine to form a substituted or unsubstituted ring, wherein R and R' are each independently selected from the group consisting of H and $C_{1-6}$ alkyl, and provided that the compound is not 2,3-dichloro-5,6-dicyano-1,4,-benzoquinone or tetrachlorobenzoquinone.

The quinone compound of Formula (I) is a class of organic compounds that are formally derived from aromatic compounds, such as benzene, naphthalene or anthracene, by conversion of an even number of —CH= groups into —C(=O)— groups with any necessary rearrangement of double bonds, resulting in a fully conjugated cyclic dione structure.

In various embodiments, each of $R_1$, $R_2$, $R_3$, and $R_4$ may be a substituted or unsubstituted $C_{1-6}$ alkyl group. In the context of various embodiments, by "$C_{1-6}$ alkyl" is meant a straight chain or branched chain hydrocarbon group having from 1 to 6 carbon atoms. A $C_{1-6}$ alkyl group may be substituted or unsubstituted. Exemplary substituents include alkoxy, aryl, aryloxy, sulfhydryl, arylthio, halogen, hydroxyl, amino, and carboxyl. $C_{1-6}$ alkyl groups include, without limitation, methyl, ethyl, n-propyl, isopropyl, n-butyl, iso-butyl, sec-butyl, tert-butyl, n-pentyl, and n-hexyl, among others.

In various embodiments, each of $R_1$, $R_2$, $R_3$, and $R_4$ may be a substituted or unsubstituted $C_{2-6}$ alkenyl group. In the context of various embodiments, by "$C_{2-6}$ alkenyl" is meant a straight chain or branched chain hydrocarbon group containing one or more double bonds and having from 2 to 6 carbon atoms. The $C_{2-6}$ alkenyl group may be substituted or unsubstituted. Exemplary substituents include alkoxy, aryl, aryloxy, sulfhydryl, arylthio, halogen, hydroxyl, amino, and carboxyl. $C_{2-6}$ alkenyl groups include, without limitation, vinyl, allyl, 1-propenyl, 1-butenyl, 2-butenyl, 3-butenyl, 2-methyl-1-propenyl, and 2-methyl-2-propenyl.

In other various embodiments, each of $R_1$, $R_2$, $R_3$, and $R_4$ may be a substituted or unsubstituted $C_{2-6}$ alkynyl group. In the context of various embodiments, by "$C_{2-6}$ alkynyl" is meant a straight chain or branched chain hydrocarbon group containing one or more triple bonds and having from 2 to 6 carbon atoms. The $C_{2-6}$ alkynyl group may be substituted or unsubstituted. Exemplary substituents include alkoxy, aryl, aryloxy, sulfhydryl, arylthio, halogen, hydroxy, amino, and carboxyl. $C_{2-6}$ alkynyls include, without limitation, ethynyl, 1-propynyl, 2-propynyl, 1-butynyl, 2-butynyl, and 3-butynyl.

In various embodiments, $R_1$ and $R_2$, $R_3$ and $R_4$, or both $R_1$ and $R_2$, and $R_3$ and $R_4$ combine to form a substituted or unsubstituted $C_5$-$C_{20}$ aryl ring.

In the context of various embodiments, the term "aryl" refers to an aromatic ring wherein each of the atoms forming the ring is a carbon atom. The term "aromatic" refers to a group comprising a covalently closed planar ring having a delocalized [π]-electron system comprising 4n+2 [π] electrons, where n is an integer. Aryl rings may be formed by 5, 6, 7, 8, 9, 10, 11, 12, 13, 14, 15, 16, 17, 18, 19 or 20 carbon atoms. Aryl groups may be optionally substituted. Examples of aryl groups include, but are not limited to phenyl, anthracenyl, phenanthrenyl, tetralinyl, naphthalenyl, fluorenyl, indenyl and indanyl. In certain embodiments, an aryl group is substituted at one or more of the para, meta, and/or ortho positions. Examples of aryl groups comprising substitutions include, but are not limited to, 3-halophenyl, 4-halophenyl, 3-hydroxyphenyl, 4-hydroxyphenyl, 3-aminophenyl, 4-aminophenyl, 3-methylphenyl, 4-methylphenyl, 3-methoxyphenyl, 4-methoxyphenyl, 4-trifluoromethoxyphenyl, 3-cyanophenyl, 4-cyanophenyl, dimethylphenyl, naphthyl, hydroxynaphthyl, hydroxymethylphenyl, (trifluoromethyl)phenyl, alkoxyphenyl, 4-morpholin-4-ylphenyl, 4-pyrrolidin-1-ylphenyl, 4-pyrazolylphenyl, 4-triazolylphenyl, and 4-(2-oxopyrrolidin-1-yl)phenyl. Generally, the aryl groups can be substituted by the same substituents disclosed above in connection with the alkyl, alkenyl and alkynyl groups. In various embodiments of the present invention the $C_{5-20}$ aryl group is phenyl, naphthalenyl, phenanthrenyl, anthracenyl, tetralinyl, fluorenyl, indenyl, or indanyl, for example napthalenyl, phenanthrenyl or anthracenyl.

In various embodiments, (1) $R_1$ and $R_2$, (2) $R_3$ and $R_4$ or (3) $R_1$ and $R_2$, and $R_3$ and $R_4$ form a ring moiety of formula

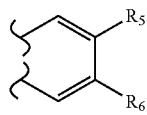

wherein $R_5$ and $R_6$ are each independently selected from the group consisting of H, halogen, —CN, —OR, —N$_3$, —C(O)OR, —C(O)R, —C(O)NRR', —NRC(O)R, —NRR', —SOR, —SO$_2$R, —NO$_2$, a substituted or unsubstituted $C_{1-6}$ alkyl group, a substituted or unsubstituted $C_{2-6}$ alkenyl group, and a substituted or unsubstituted $C_{2-6}$ alkynyl group, wherein R and R' are each independently selected from the group consisting of H and $C_{1-6}$ alkyl.

In various embodiments, $R_1$ and $R_2$ combine to form a 6-membered aromatic ring wherein $R_5$ and $R_6$ are hydrogen.

In various embodiments, $R_3$ and $R_4$ combine to form a substituted 6-membered aromatic ring wherein at least one of $R_5$ and $R_6$ is not hydrogen.

In yet another embodiment, $R_3$ and $R_4$ combine to form a substituted 6-membered aromatic ring when $R_6$ is hydrogen and $R_5$ is a $C_{1-6}$ alkyl.

In yet another embodiment, $R_3$ and $R_4$ combine to form a substituted 6-membered aromatic ring when $R_6$ is hydrogen and $R_5$ is a $C_{1-6}$ alkyl substituted with hydroxyl.

In one embodiment, the quinone compound may be a naphthoquinone or more specifically, 1,4-naphthoquinone.

In another embodiment, the quinone compound may be an anthraquinone or more specifically, 9-10-anthraquinone.

In one embodiment, the quinone compound is 2-ethylanthraquinone (EAQ)

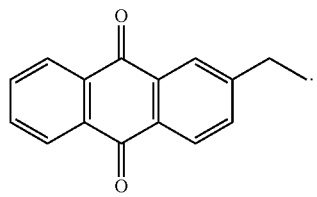 [SMILES: CCc1ccc2c(c1)C(=O)c1ccccc1C2=O]

In another embodiment, the quinone compound is 2-(hydroxymethyl)-anthraquinone (HMAQ)

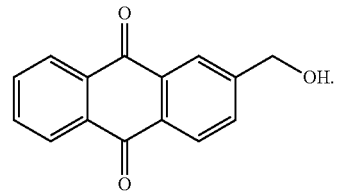 [SMILES: O=C1c2ccccc2C(=O)c2cc(CO)ccc21]

A carbon nanotube is a cylinder of rolled up graphitic sheets. Carbon nanotubes exist in different forms, such as single-walled carbon nanotubes (SWNT), double-walled carbon nanotubes (DWNT), multi-walled carbon nanotubes (MWNT), or modified multi-walled carbon nanotubes. The carbon nanotubes may be of any desired length, such as in the range from about 0.1 nm to about 10 µm, such as about 1 nm to about 5 µm or 10 nm to about 1 µm. In one embodiment the carbon nanotubes may be at least 1 µm or at least 2 µm or between about 0.5 µm and about 1.5 µm or between about 1 µm and about 5 µm. Depending on the arrangement of the carbon hexagon rings along the surface of the nanotubes, carbon nanotubes can be metallic or semiconducting. Any such carbon nanotubes may be used in a method according to various embodiments.

A single-walled carbon nanotube (SWNT) is a seamless cylinder formed from one graphite layer. For example, carbon nanotubes can be described as a graphite plane (so called graphene) sheet rolled into a hollow cylindrical shape so that the structure is one-dimensional with axial symmetry, and in general exhibiting a spiral conformation, called chirality. A single-wall nanotube can be defined by a cylindrical sheet with a diameter of about 0.7 to about 20 nm, such as about 1 to about 20 nm.

Various embodiments of the inventive methods may start from single-walled carbon nanotubes, for example, CoMo-CAT SWNTs, which may be grown by carbon monoxide (CO) disproportionation (decomposition into C and $CO_2$) at 700-950° C. in flow of pure CO at a total pressure that typically ranges from 1 to 10 atm using a catalyst comprising cobalt (Co) and molybdenum (Mo) on a mesoporous silica support.

In various embodiments, the method is for enriching specific species of carbon nanotubes. "Enriching" in this respect means that the different types of nanotubes which may be present in the as-synthesized nanotubes are separated or purified such that the proportion of at least one specific type of nanotube is increased after the enrichment compared to the starting material. In one embodiment, this enrichment allows isolation of a single nanotube species with specific electronic properties from a given nanotube material. Generally, the method enables the enrichment of nanotubes according to their electronic properties and/or diameter. In this respect, the term "a composition of carbon nanotubes" as used in various embodiments means that at least two or more different carbon nanotube species are present in the system. In one embodiment, semiconducting single-walled carbon nanotubes (SWNT) are enriched. In one embodiment, the carbon nanotubes may be as-synthesized carbon nanotubes or as-produced carbon nanotubes.

The arrangement of the carbon hexagon rings in the carbon nanotubes can be characterized by the chiral vector of the carbon nanotubes. Chiral vector is a two dimensional vector (p, q) that is used to describe the geometry of carbon nanotubes. The values of p and q determine the chirality, or "twist" of the nanotube. The chirality in turn affects properties such as conductance, density, and lattice structure of the carbon nanotubes. Depending on the arrangement of the carbon hexagon rings along the surface of the nanotube as characterized by its chiral vector, carbon nanotubes can be metallic or semiconducting. For example, SWNTs can be metallic when p−q=3r, where r is an integer, and can be semiconducting otherwise. In the context of various embodiments, metallic SWNTs refer to carbon nanotubes with non-zero density of states (DOS) at its Fermi level. The term "density of states" refers to the number of states at an energy level that are available to be occupied, and the term "Fermi level" refers to an energy level with a probability of 50 percent for existence of an electron. Therefore, a SWNT can be metallic when the DOS value at its Fermi level is not zero. In the context of various embodiments, semiconducting SWNTs refer to carbon nanotubes with varying band gaps, wherein the term "band gap" refers to difference in energy between the valance band and the conduction band of a material. Such carbon nanotubes can be separated or enriched by a method according to various embodiments. In one embodiment, the carbon nanotubes may be a mixture of nanotubes with different electronic properties and/or sizes. Thus, the method allows the enrichment according to electronic properties in order to separate metallic SWNT from semiconducting SWNT. Additionally, enrichment is made according to diameter. This means, that the respective nanotubes are enriched or separated depending on their particular diameter. For example, it is possible with the method of various embodiments to enrich SWNT having a diameter below about 0.9 nm from SWNT having a diameter equal or above 0.9 nm. In one embodiment SWNT above and below about 0.6 nm, above and below about 0.7 nm, above and below about 0.75 nm, above and below about 0.8 nm, above and below about 0.85 nm, above and below about 0.95 nm, or above and below about 1 nm may be enriched. In one embodiment, SWNT having a diameter ranging from about 0.7 nm to about 1 nm is enriched.

In various embodiments, enrichment according to diameter allows to separate semiconducting single-walled carbon nanotubes with larger diameter from semiconducting single-walled carbon nanotubes with smaller diameter.

In order to achieve the desired enrichment, in the contacting step, the composition of carbon nanotubes is suspended in an organic solvent containing the quinone compound according to various embodiments. In the reacting step, the suspension is incubated under conditions that allow the quinone compounds to form radicals that react with at least one specific species of the carbon nanotubes.

The term "radicals" refers to atoms, molecules, or ions with unpaired electrons on an open shell configuration. Free radicals may have positive, negative, or zero charge.

In various embodiments, by leaving the quinone compounds to stand, they decompose into radicals in small quantities which preferentially react with the smaller diameter metallic SWNTs. In this connection, the term "react" includes the adsorption of the quinone radicals to the nanotubes and includes covalent as well as non-covalent interactions. Carbon nanotubes are radical scavengers. Compounds, for example 2-ethylanthraquinone (EAQ) or 2-(hydroxymethyl)-anthraquinone (HMAQ) with metallicity-based discrimination contain carbonyl linkages which can form radicals. In one embodiment, the radical may be a —OH radical, which preferentially adsorbs to SWNTs in the order of small diameter metallic, followed by small diameter semiconducting SWNT over larger diameter semiconducting SWNT.

In various embodiments, the conditions that allow quinone radical formation may include the exposure of the suspension to light of a wavelength of 280 to 700 nm. In various embodiments, the suspension may be incubated under light irradiation, for example, ambient lighting conditions or UV irradiation. The UV irradiation may have a wavelength range of 280 nm to 380 nm. In one embodiment, the UV irradiation may have a wavelength of 365 nm.

In one embodiment where incubation is carried out under ambient lighting conditions, the suspension may be incubated for 5 to 10 days, 5 to 8 days, 6 to 9 days, 6 to 8 days, 7 to 10 days, or 7 to 9 days. In one embodiment, the suspension may be incubated for 7 days.

In another embodiment where incubation is carried our under UV irradiation, the suspension may be incubated for about 10 to about 20 minutes, about 10 to about 15 minutes, about 15 to about 20 minutes, about 10 to about 12 minutes, about 12 to about 15 minutes, about 12 to about 18 minutes, about 15 to about 18 minutes or about 18 to about 20 minutes. In one embodiment, the suspension may be incubated for about 15 minutes.

In the context of various embodiments, the term "organic solvent" may be selected from the group consisting of hexane, heptane, cyclohexane, benzene, pyridine, dichloromethane, chloroform, carbon tetrachloride, carbon disulfide, tetrahydrofuran, dioxane, diethyl ether, diisopropylether, ethylene glycol monobutyl ether, methyl ethyl ketone, methyl isobutyl ketone, acetone, cyclohexanone, ethyl acetate, isobutyl isobutyrate, ethylene glycol diacetate, dimethylformamide, acetonitrile, N,N-dimethyl acetamide, nitromethane, acetonitrile, N-methylpyrrolidone, dimethylsulfoxide water, methanol, ethanol, butyl alcohol and formic acid. In one embodiment, the organic solvent may be dimethylformamide (DMF). In one embodiment, the solvent may be DMF and dichloromethane, or acetone, or ethanol.

In various embodiments, the separating step may comprise after centrifugating the suspension to separate the different species of carbon nanotubes. In various embodiments, the separating step may further comprise: filtering the supernatant obtained after centrifugation to obtain carbon nanotubes enriched with respect to one specific species of carbon nanotubes; optionally washing the obtained carbon nanotubes with a solvent; and optionally repeating the filtering and washing steps.

The centrifugation may be carried out with generally used conditions. For example, the centrifugation may be carried out, but is not limited to, at least about 5 minutes, at least about 10 minutes, at least about 15 minutes, at least about 20 minutes, at least about 25 minutes, at least about 30 minutes, at least about 35 minutes, at least about 40 minutes, at least about 45 minutes, at least about 50 minutes, or at least about 55 minutes. In one embodiment the centrifugation is carried out for 1 hour. The centrifugation speed may be, but is not limited to, about 10,000 g, about 20,000 g, about 30000 g or more.

The washing of the carbon nanotubes may be carried out with the same organic solvents that have been disclosed above. Suitable solvents thus include toluene, hexane, heptane, cyclohexane, benzene, pyridine, dichloromethane, chloroform, carbon tetrachloride, carbon disulfide, tetrahydrofuran, dioxane, diethyl ether, diisopropylether, ethylene glycol monobutyl ether, methyl ethyl ketone, methyl isobutyl ketone, acetone, cyclohexanone, ethyl acetate, isobutyl isobutyrate, ethylene glycol diacetate, dimethylformamide, acetonitrile, N,N-dimethyl acetamide, nitromethane, acetonitrile, N-methylpyrrolidone, dimethylsulfoxide water, methanol, ethanol, butyl alcohol and formic acid. In one embodiment, the organic solvent may be dimethylformamide (DMF). In one embodiment, the solvent may be DMF and dichloromethane, or acetone, or ethanol.

According to various embodiments, the enriched carbon nanotubes after filtering and washing may be dried and re-suspended in a surfactant-containing solvent. The enriched carbon nanotubes may comprise an increased proportion of semiconducting single-walled carbon nanotubes compared to the starting mixture of carbon nanotubes. The term "surfactant" refers to a compound that lowers the surface tension of a liquid, the interfacial tension between two liquids, or that between a liquid and a solid. For example, surfactants may act as detergents, wetting agents, emulsifiers, foaming agents, and dispersants. In one embodiment, the surfactant may be sodium dodecyl sulfate (SDS). In one embodiment, the surfactant may be 1% sodium dodecyl sulfate (SDS).

The method according to various embodiments enables the enrichment or separation of specific species of carbon nanotubes. Depending on the quinone compound in various embodiments, different carbon nanotubes can be enriched. Thus, modification, in particular of the aromatic moiety of the quinone compound may be used to adapt the enrichment as suitable for the respective nanotubes. In one embodiment, the quinone compounds referred to herein, such as 2-ethylanthraquinone (EAQ) and 2-(hydroxymethyl)-anthraquinone (HMAQ) have been successfully employed in the separation of SWNTs according to their electronic properties and diameters and highly effective enrichment has been achieved.

In various embodiments, strong selectivity towards certain SWNTs species with specific electronic properties and diameters, removal of metallic SWNTs and enrichment of larger diameter semiconducting species treating with the quinone compound, for example an anthraquinone, may be shown by several methods, for example optical absorbance spectra (for example, Ultraviolet-visible-Near Infrared (UV-vis-NIR) absorbance spectra), photoluminescence excitation (PLE) maps and Raman spectra.

In various embodiments, EAQ or HMAQ may be used to enrich semiconducting CoMoCAT SWNTs. To separate other grades of SWNTs, for example, larger diameter SWNT grades such as HiPco SWNTs (0.9-1.1 nm) or Arc-discharge SWNTs (1.2-1.6 nm), diameter selection may be conducted before applying EAQ or HMAQ separation since the radicals of EAQ or HMAQ do not react with the larger diameter nanotubes or the difference between small diameter semiconducting and larger diameter metallic nanotubes in these types of grades with wide ranges of diameters and chiralities is small.

HiPco SWNTs are synthesized using high pressure carbon monoxide (HiPCo). For example, in a HiPco method, metal catalyst is formed in situ when $Fe(CO)_5$ or $Ni(CO)_4$ is injected into a reactor along with a stream of CO gas at a temperature range of about 900-1100° C. at a pressure of about 30 to 50 atm. The metal catalyst formed may be in the form of nanometer sized particles. HiPCo SWNTs may be produced following the disproportionation of CO by the metal catalyst particles.

Arc-discharge SWNTs are synthesized using various types of plasmas and electrodes that are known to produce a range of carbonaceous structures as the vaporized carbon is condensed. The condensed state can be described as a carbonaceous web, which radiates from a cathode, and a solid deposit on the cathode surface. Amorphous carbon, fullerenes, single- or multi-walled carbon nanotubes are among the structures present in these condensed areas.

The single-walled carbon nanotubes enriched by the method in accordance to various embodiments may also be used as field-effect transistors (FETs). Basically, the FET structure involves two metal electrodes designated as "source" and "drain" connected by a semiconducting channel. In the FET of various embodiments, the channel may be a semiconducting single-walled carbon nanotube enriched by the method according to various embodiments. The single-walled carbon nanotube of various embodiments may also be used in an optical or an optoelectronic device, such as transistors, memory devices and optoelectronic couplers.

In one embodiment, the FET may be a single-walled carbon nanotube network-based thin film transistor (TFT). For example, TFTs using SWNTs after treatment with EAQ according to the invention as the semiconducting layer have mobilities of 0.2 $cm^2/V \cdot sec$ and on/off ratios of 104. The performances of TFTs are greatly enhanced (~2 order) by using semiconductor-enriched SWNTs instead of the unseparated SWNTs-TFTs.

Various embodiments illustratively described herein may suitably be practiced in the absence of any element or elements, limitation or limitations, not specifically disclosed herein. Thus, for example, the terms "comprising", "including", "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of various embodiments. Thus, it should be understood that although various embodiments have been specifically disclosed by preferred embodiments and optional features, modification and variation of the various embodiments herein disclosed may be resorted to by those skilled in the art, and that such modifications and variations are considered to be within the scope of the various embodiments.

Various embodiments have been described broadly and generically herein. Each of the narrower species and subgeneric groupings falling within the generic disclosure also form part of the various embodiments. This includes the generic description of various embodiments with a proviso or negative limitation removing any subject matter from the genus, regardless of whether or not the excised material is specifically recited herein.

Other embodiments are within the following claims and non-limiting examples. In addition, where features or aspects of various embodiments are described in terms of Markush groups, those skilled in the art will recognize that various embodiments are also thereby described in terms of any individual member or subgroup of members of the Markush group.

EXPERIMENTAL SECTION

Materials

SWNTs produced by the CoMoCAT process (SWeNT® SG65 with at least 90 wt % carbon purity) are from Southwest Nanotechnologies. The as-supplied CoMoCAT SWNTs have species distributions weighted toward the (6,5) species. Dimethylformamide (DMF) is used for the SWNTs dispersion. 2-ethylanthraquinone (EAQ) and other chemicals are from Sigma-Aldrich, unless otherwise specified.

Preparation of Semiconducting-SWNTs Enriched Solutions

A mixture of SWNTs powder (1 mg), EAQ (50 mg) and DMF (30 ml) is homogenized by sonication for 10 min using a water-bath sonicator and 20 min using a tip ultrasonicator at 80 W in an ice bath. The SWNTs finely dispersed in EAQ/DMF solution are left standing and incubated in ambient conditions for 7 days. Then the suspension is centrifuged for 1 hour at 10 Kg to remove the metallic SWNTs, nanotube bundles and other impurities. Subsequently, the homogeneous supernatants are collected and filtered through a polytetrafluoroethane (PTFE) membrane (pore size of 0.2

μm). The solid SWNTs are washed with DMF (50 ml) and dichloromethane (50 ml). The SWNTs are then re-dispersed in DMF (50 mL) and filtered through a PTFE membrane (0.2 μm), re-dispersed in acetone (50 mL) and filtered through a PTFE membrane (0.2 μm), and finally re-dispersed in ethanol (50 mL) and filtered through a PTFE membrane (0.2 μm) and are dried overnight at 120° C. to afford semiconductor-enriched SWNTs solids. These are re-dispersed in 20 ml of 1% sodium dodecyl sulfate (SDS) DI water solution by sonication for 10 min using a tip ultrasonicator set at 80 W in an ice bath for spectroscopic and electrical properties measurements.

Optical Absorption Spectroscopy

Ultraviolet (UV)-visible(vis)-near infrared (NIR) absorption spectroscopy is conducted in transmission mode on a Varian Cary 5000 UV-vis-NIR spectrophotometer. Fluorescence characterization is performed on Jobin-Yvon Nanolog-3 spectrofluorometer with an InGaAs detector.

FIG. 1(a) shows the UV-vis-NIR spectra of pristine SWNTs 100 and SWNTs after treatment with EAQ 102.

The pristine SWNTs 100 are composed of several major (6,5), (7,5), (7,6), (8,4), (6,4) and (5,4) semiconducting species, which show first van Hove transitions $S_{11}$ UV-vis-NIR absorption peaks in the 500-750 nm range and second van Hove transitions $S_{22}$ absorption peaks in the 800-1200 nm range. The pristine SWNTs 100 show UV-vis-NIR absorption peaks in the 400-490 nm range due to the metallic species first van Hove electronic transitions $M_{11}$.

After treating SWNTs by using EAQ in DMF, and finally dispersing in 1% sodium dodecyl sulfate (SDS) solution, under the same condition of the pristine SWNTs 100, the SWNTs after treatment with EAQ 102 show UV-vis-NIR absorption peaking in the 400-490 nm range being selectively bleached, which indicate that metallic tubes are optically suppressed, i.e., relative depletion of metallic tubes with respect to semiconducting tubes.

Some absorption peak from semiconducting species (6,4) is reduced, and the absorption peak from semiconducting species (6,5) is also reduce but it still remains dominant due to its initial abundance. While the absorption peaks from some other larger diameter semiconducting species such as (7,5), (7,6) and (8,4) are not reduced.

To further explore the radical involvement in the mechanism of the observed selectivity of EAQ, two similar molecules, specifically 2-ethylanthracene (EAC)

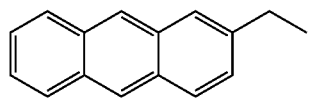 [SMILES: CCc1ccc2cc3ccccc3cc2c1]

and 2-(hydroxymethyl)-anthraquinone (HMAQ)

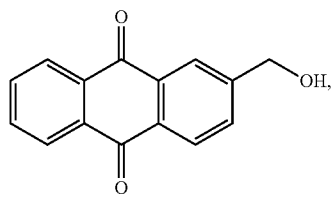 [SMILES: O=C1c2ccccc2C(=O)c2cc(CO)ccc21]

are used to treat the SWNTs.

Figure 1B:
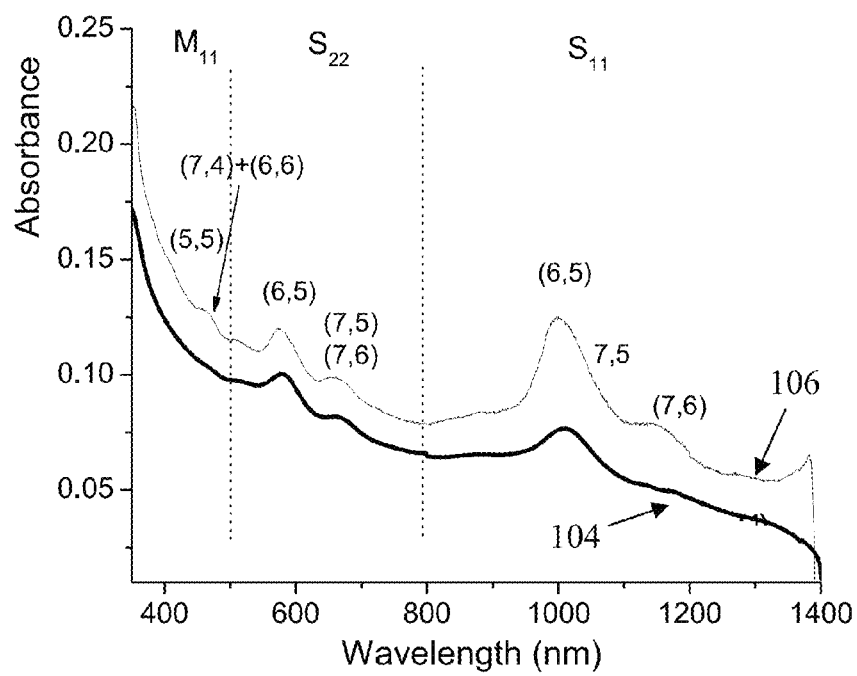

FIG. 1(b) shows the UV-vis-NIR spectra of SWNTs after treatment with HMAQ 104 and after treatment with EAC 106.

In FIG. 1(b), HMAQ 204, similar to EAQ 102, is shown to discriminate between metallic and semiconducting CoMoCAT SWNT while EAC 106 does not discriminate. Comparison of the structures of the three molecules EAQ, HMAQ and EAC indicates that the two molecules of EAQ and HMAQ with metallicity-based discrimination contain carbonyl linkages which can form radicals while the EAC does not.

From FIGS. 1(a) and 1(b), it is shown that the two C═O group quinone structure and three benzene ring aromatic structure provide for effective separation. The separation mechanism is suggested that SWNTs can disperse well in DMF solution, after adding for example EAQ the aromatic structure in EAQ can selectively interact with different chiral tubes, then after balance of few days the selective metallic SWNTs and small diameter SWNTs (6,5) by EAQ are precipitated during centrifugation, and the larger diameter semiconducting SWNTs are enriched in the supernatant.

However, it cannot be observed that metallic and semiconducting tube separation for larger diameter SWNTs, such as HiPCo SWNTs (0.9-1.1 nm) or Arc-discharge SWNTs (1.2-1.6 nm), via the extraction using EAQ, indicating that the three benzene ring aromatic structure of anthraquinone may be suitable for separating small metallic SWNTs. Larger aromatic ring structure compounds may be needed to separate larger diameter SWNTs.

Additionally, the selectivity of another quinone compound, tetrachlorobenzoquinone (TCBQ)

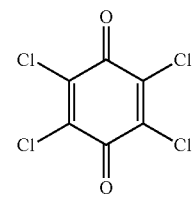 [SMILES: O=C1C(Cl)=C(Cl)C(=O)C(Cl)=C1Cl]

is explored.

Under the same conditions as EAQ, after sonication in TCBQ/DMF solution the SWNTs do not disperse well in DMF solution. Almost all SWNTs precipitated in one hour so that only a very small amount of SWNTs remain in the supernatant. The supernatant is carefully collected and filtered. The solid SWNTs are washed and re-dispersed in SDS solution and the UV-vis-NIR spectrum is measured.

Figure 1C:
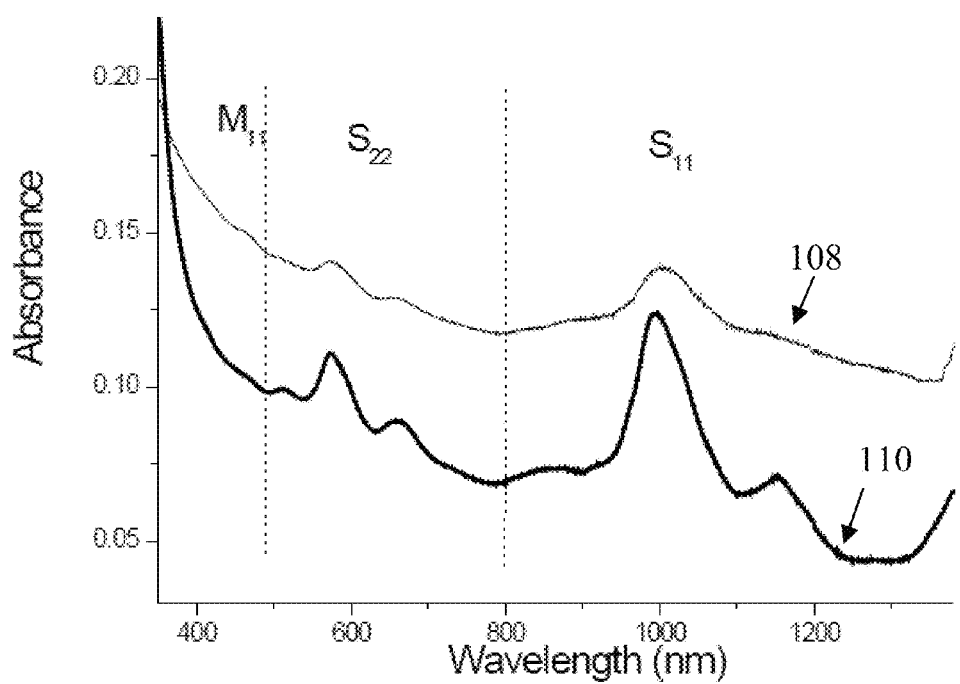

FIG. 1(c) shows the UV-vis-NIR spectra of SWNTs after treatment with TCBQ 108 and after treatment with EAQ 110.

From FIG. 1(c), the $M_{11}$ peaks in 400-490 nm are decreased but not totally suppressed. As TCBQ 108 is much more reactive with SWNTs than EAQ 110, it very easily reacts with SWNTs in a short time so that the amount of SWNTs remaining in the supernatant is very small. Because of the very low yield of suspended SWNTs, TCBQ 108 is not suitable for metallicity-based separation SWNTs. The redox potential (the electron-accepting ability) of TCBQ is (0.227 V) much higher than EAQ (−0.942 V), which means that TCBQ more readily forms radicals to react with SWNTs than does EAQ. The redox potential of TCBQ is high enough to directly receive the electrons from the valence band (V1) of semiconducting species so that metallic and semiconducting nanotubes cannot be easily discriminated. By contrast, EAQ is weak in redox so that EAQ is only able to access the electrons from metallic tubes (as there are always electrons between V1 and C1), but not able to reach the V1 electrons of semiconducting tubes (there are no electrons in between V1 and C1 in semiconducting tubes). The results from exemplary experiment using TCBQ should be applicable to benzoquinone compounds in general because the redox potential of benzoquinone being −0.255 V, similar to TCBQ, may be too reactive and non-discriminatory between metallic and semiconducting.

Raman Spectra

Raman spectra from the samples are measured with a Renishaw Ramanscope in the backscattering configuration, and Stokes spectra of the samples are obtained with 514.5 nm and 633 nm lasers.

Resonance Raman spectroscopy is used to study SWNTs for example, the nanotube chirality, electronic type and degree of chemical functional groups (or defects). Different lasers bring different SWNTs, depending on types (metallic or semiconducting) and diameters, into resonant scattering since the energy of the interband electronic transition depends on these two parameters. As the pristine SWNTs have diameters ranging from 0.7 to 0.9 nm, Raman Resonance Scattering (RRS) excitation with 514.5 nm (2.41 eV) and 633 nm (1.96 eV) probes metallic and semiconducting SWNTs. The Radial Breathing Mode (RBM) typically in 100-400 $cm^{-1}$ is inversely proportional to the diameter of the nanotube.

Figure 2:
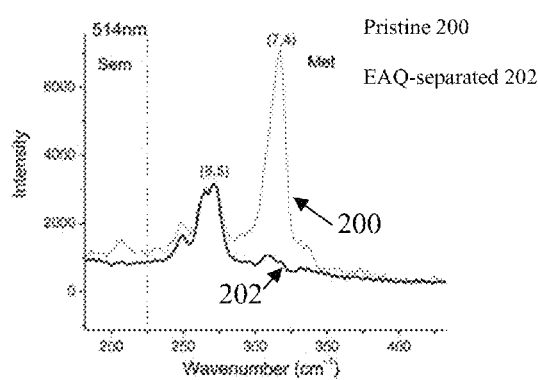
FIG. 2i(a), FIG. 2i(b), FIG. 2ii(a) and FIG. 2ii(b) show Raman spectra, according to various embodiments.
Figure 2:
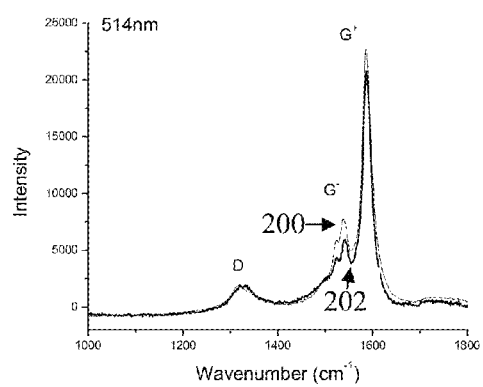
Figure 2:
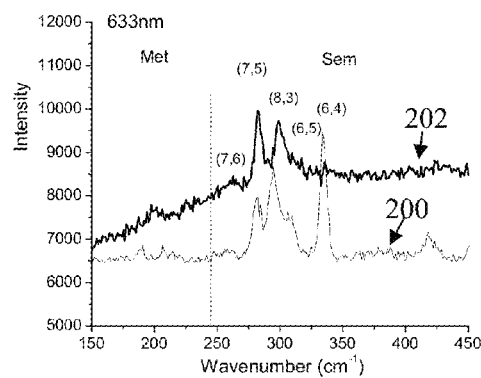
Figure 2:
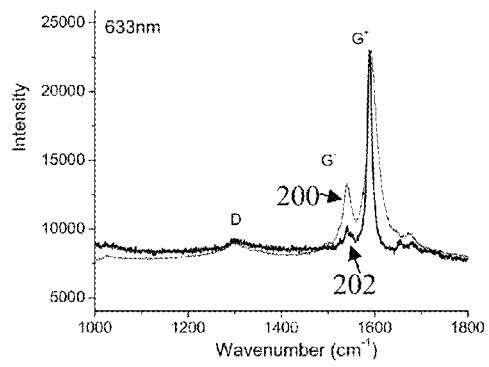

FIG. 2$i$($a$), FIG. 2$i$($b$), FIG. 2$ii$($a$) and FIG. 2$ii$($b$) show Raman spectra of pristine SWNTs 200 and SWNTs after treatment with EAQ 202 (i) using 514 nm laser and (ii) using 633 nm laser in (a) the RBM section (b) the Raman D and G bands.

FIG. 2$i$($a$) shows the RRS spectra of pristine SWNTs 200 and EAQ-separated SWNTs 202 using a 514 nm laser: the smaller (7,4) metallic nanotubes distinctly decrease while the larger diameter (8,5) metallic nanotube concentration does not change with the EAQ treatment 202. In the RBM spectra obtained using 633 nm laser (FIG. 2$ii$($a$)), the peaks about 283 $cm^{-1}$ are attributed to semiconducting species (7,5), the peaks about 295 $cm^{-1}$ are attributed to semiconducting species (8,3), the peaks about 310 $cm^{-1}$ are attributed to semiconducting species (6,5) and the peaks about 333 $cm^{-1}$ are attributed to semiconducting species (6,4). It is observed that after separating SWNTs by using EAQ 202, the semiconducting species (6,4) and semiconducting species (6,5) are decreased, which indicate that small diameter metallic SWNTs are suppressed. While the peak of larger diameter semiconducting species (7,5) and (7,6) are not reduced, which indicate that larger diameter semiconducting species SWNTs react with EAQ.

FIGS. 2$i$($b$) and 2$ii$($b$) show that the longitudinal G bands from metallic-species at about 1540 $cm^{-1}$ were reduced after separation, indicating that metallic tubes have been optically suppressed. The D band from SWNTs is almost not change after separating SWNTs by using EAQ 202, which indicate that during separating process there are physical absorption but not chemical bonding between SWNTs and EAQ. The D band is dispersive and is linked to the reduction in symmetry of the SWNTs as result of functionalization or the presence of defects, and the ratio of this band with the tangential band (G) is widely used to assess the degree chemical modification in SWNTs.

The Raman data show that smaller diameter species, whether metallic or semiconducting, are depleted after EAQ treatment.

The change of abundance of metallic species (using Raman and/or UV-vis-NIR) after EAQ separation is shown in Table 1.

TABLE 1

Change of abundance of metallic species (using Raman and/or UV-vis-NIR) after EAQ separation

| Species | Diameter | Chiral Angle | $M_{11}$ (eV) | $\omega_{RBM}$ (nm) | Change |
|---|---|---|---|---|---|
| (5, 5) | 0.688 | 30 | 2.91 | 338 | ↓ |
| (6, 6) | 0.825 | 30 | 2.60 | 283 | ↓ |
| (7, 4) | 0.75 | 21.1 | 2.61 | 308 | ↓ |
| (8, 5) | 0.89 | 22.4 | 2.43 | 265 | Same |

Photoluminescence Emission (PLE) Maps

Although metallic SWNTs do not present in PLE, PLE is very sensitive to characterize semiconducting SWNTs and the relative PLE intensities are used to determine the abundance of different semiconducting SWNTs. So the change of semiconducting SWNTs abundance during separating by EAQ are quantified by using the intensity extracted from PLE map.

Figure 3A:
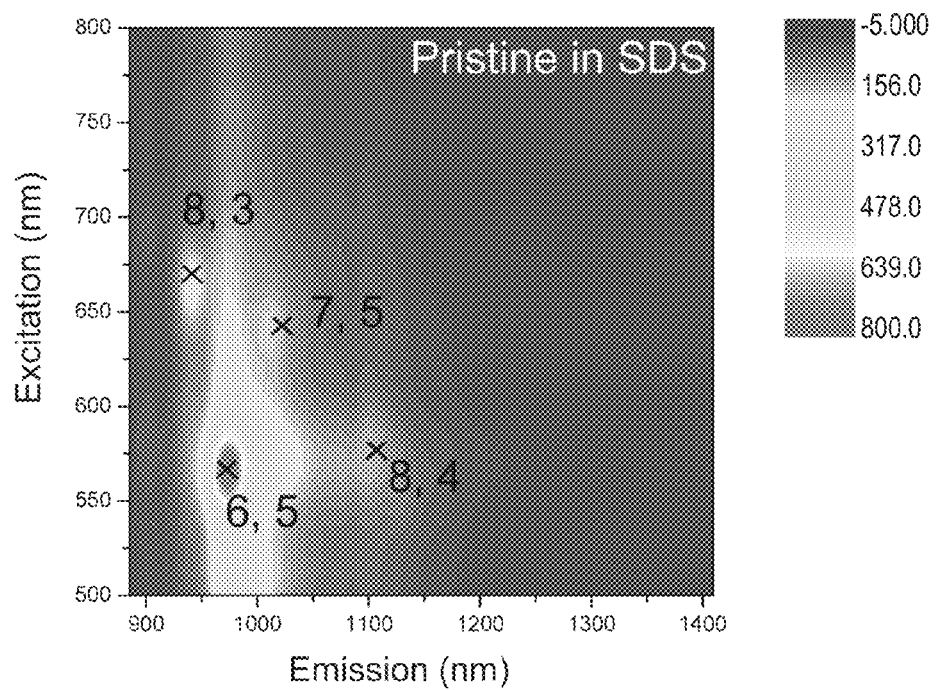
FIGS. 3(a) and 3(b) show PLE intensity maps, according to various embodiments.
Figure 3B:
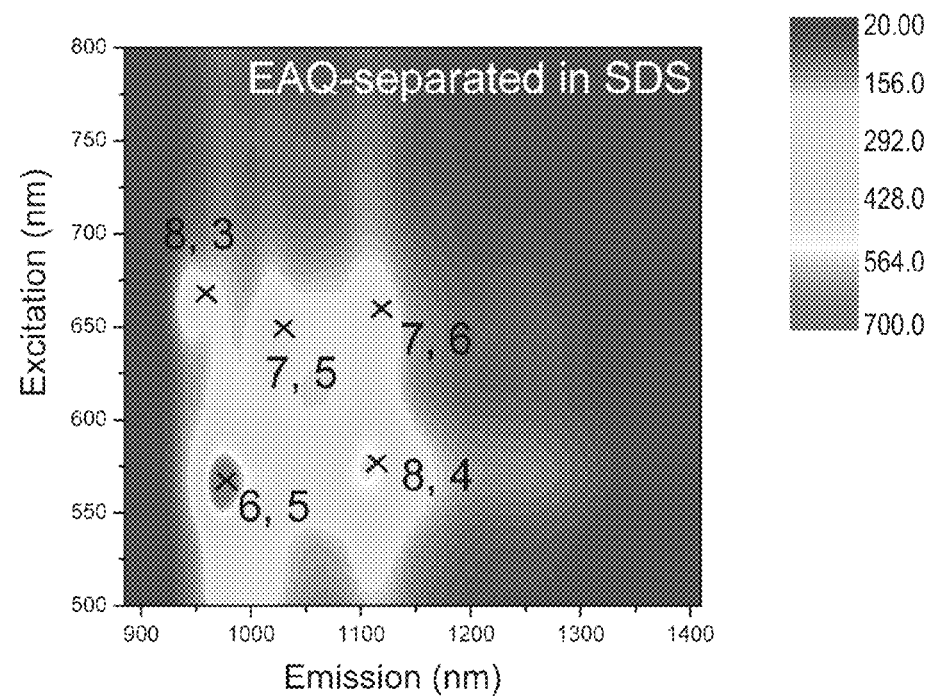
Figure 3C:
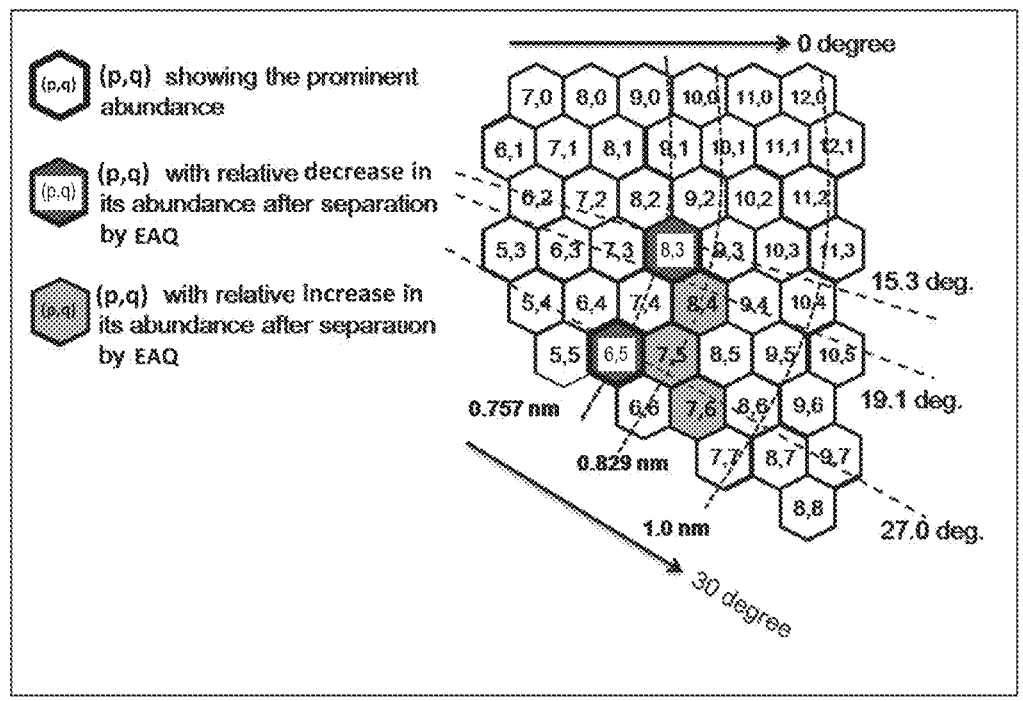
FIG. 3(c) shows a graphene sheet map, according to one embodiment.

FIGS. 3($a$) and 3($b$) show the photoluminescence emission (PLE) maps of pristine and EAQ-separated SWNTs. When a specific nanotube chirality species is excited with energy similar to its secondary $E_{22}$ transition, that species emits energy corresponding to its primary $E_{11}$ transition. Table 2 summaries the relative abundances of various species taking into account the different photoluminescence (PL) quantum efficiency of the species.

TABLE 2

Change of abundance of semiconducting species after EAQ separation

| | | | | Before separation | | After separation | |
|---|---|---|---|---|---|---|---|
| (p, q) | Diameter (nm) | Chiral Angle (Deg) | Calculated intensity | Relative PL Peak Intensity % | Calibrated PL intensity % | Relative PL Peak Intensity % | Calibrated PL intensity % |
| (6, 5) | 0.757 | 27.0 | 0.67 | 67.5% | 72.9% | 45.9% | 44.1% |
| (8, 3) | 0.782 | 15.3 | 2.13 | 16.7% | 5.7% | 10.7% | 3.2% |
| (7, 5) | 0.829 | 24.5 | 0.71 | 6.3% | 6.4% | 15.7% | 14.2% |
| (8, 4) | 0.840 | 19.0 | 0.46 | 9.5% | 15.0% | 22.2% | 31.0% |
| (7, 6) | 0.895 | 27.5 | 0.47 | 0 | 0 | 5.5% | 7.5% |

* (6, 4) is not detectable by PLE in the wavelength range in this experiment.

For the pristine sample, Table 2 and FIG. 3($a$) show that the intensity due to the (6,5) species is much stronger than those of (8,3), (7,5) and (8,4) species. Table 2 and FIG. 3($b$) also show that after separation with EAQ, the (6,5) species still dominates the PLE map but the relative intensities of (7,5), (8,4) and (7,6) species (relative to (6,5)) increase compared to before separation, especially the (8,4) species. The decrease of relative abundances of (6,5) and (8,3) species indicates that EAQ preferentially reacts with smaller diameter semiconducting SWNTs and causes the smaller diameter tube/EAQ to precipitate out. Table 2 also shows that treatment with EAQ diminishes the abundance of the smaller diameter semiconducting (6,4) and (6,5) species relative to the larger diameter species (for example, (7,5), (8,3)).

FIG. 3($c$) shows a graphene sheet map of semiconducting-SWNTs having larger diameters (i.e. (7,5), (8,4) and (7,6) of 0.83 nm, 0.84 nm and 0.89 nm, respectively) are enriched relative to semiconducting-SWNTs with smaller diameters (i.e. (6,5) and (8,3) of 0.76 nm and 0.78 nm, respectively) after treatment with EAQ.

X-Ray Photoelectron Spectroscopy (XPS) Spectra

Figure 4A:
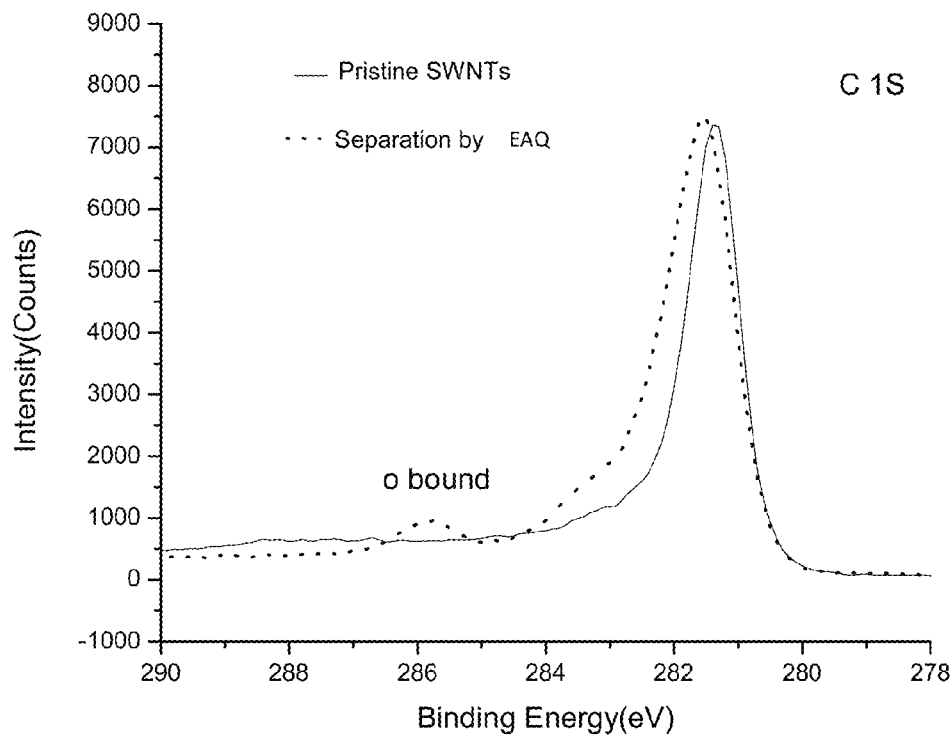
FIG. 4(a) and FIG. 4(b) show shows X-Ray photoelectron spectroscopy (XPS) spectra, according to various embodiments.

XPS measurements are recorded using a Kratos Axis-ULTRA X-ray photoelectron spectroscope with a monochromatic Al—K X-ray source (1486.7 eV) in an ultrahigh-vacuum environment of $10^{-9}$ Torr. Survey spectra are made with a pass energy of 160 eV and a step size of 1 eV and high-resolution spectra are made with a pass energy of 40 eV and a step size of 0.1 eV. The main C1s peak is shifted to 285 eV to compensate for surface charging effects as shown in FIG. 4(a).

Figure 4B:
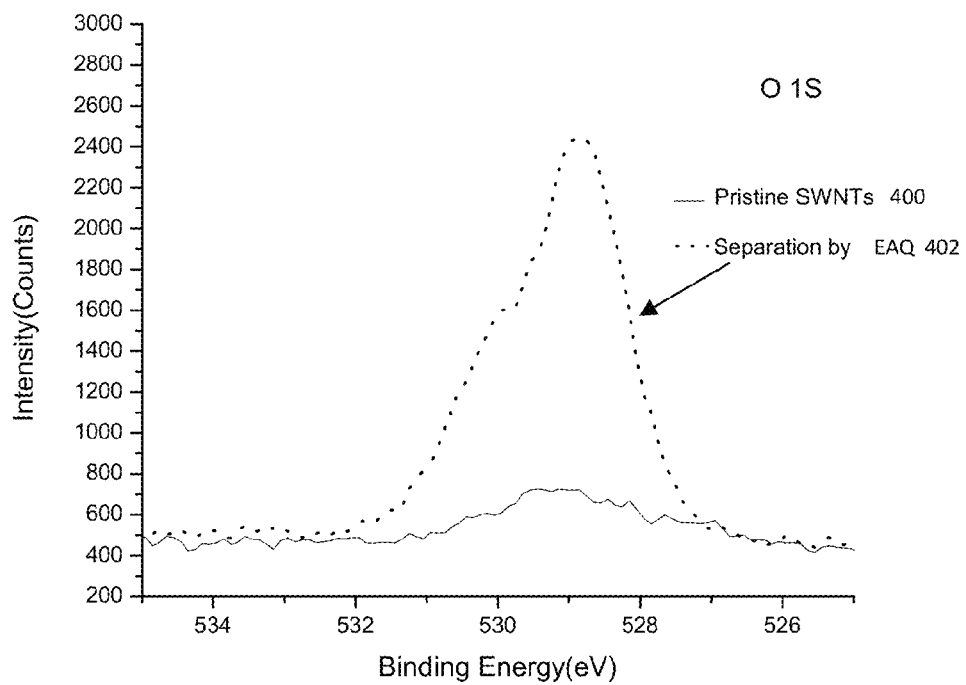

X-Ray photoelectron spectroscopy (XPS) spectra are collected for the pristine SWNTs 400 and SWNTs separated by EAQ 402. FIG. 4(b) shows that the peak intensity of the oxygen was increased after separating by EAQ 402, resulting from introduction of some little unwashed EAQ attach on SWNTs, which indicate that a small amount of EAQ physically blends with SWNTs through π-π stacking interaction between EAQ and SWNTs.

From the three spectroscopic results it is shown that, through treating with EAQ in DMF, metallic SWNTs are removed and larger diameter semiconducting species is enriched. But EAQ, which have very short alkyl chain, has no dispersion effect of SWNTs in toluene. The metallic SWNTs with attached EAQ radical (density: 1.1807 g/cc) is denser than the pristine nanotubes in DMF (density: 0.944 g/cc).

Field-Effect Transistor

To confirm the metallic versus semiconducting separation effect of EAQ, field effect transistors (FETs) with SWNT networks as the active channels are made. Devices obtained from semiconducting-SWNT enriched samples with lower metallic nanotube content should exhibit higher on-off ratios than devices made with pristine SWNT samples under the same fabrication and characterization conditions.

Figure 5A:
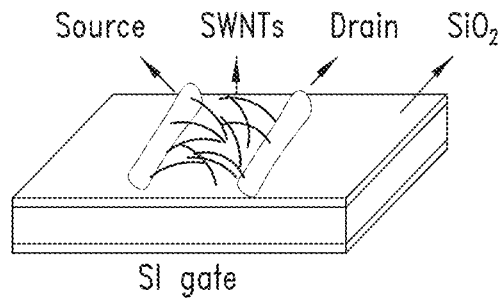
FIG. 5(a) shows a schematic drawing of a SWNT thin-film FET, according to one embodiment.
Figure 5B:
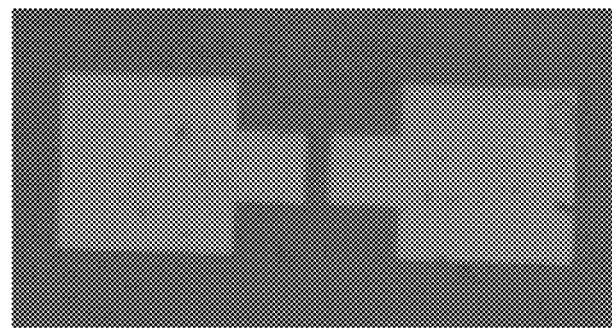
FIGS. 5(b) and 5(c) show optical images of TFT device, according to various embodiments.
Figure 5C:
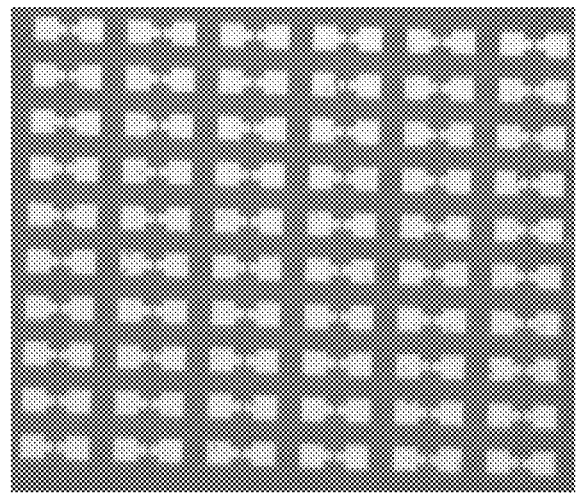

FIG. 5a shows the schematic drawing of SWNT thin film FETs. SWNT networks lie on the top of Au electrodes which permit the efficient testing of various SWNT samples. The channel length (source-drain distance) is 20 µm and the channel width is 60 µm, as shown in the optical micrograph in FIG. 5b. The gate dielectrics is a 300 nm $SiO_2$ layer. The FET device is fabricated by a simple dropcasting method from semiconducting enrichment SWNTs solution after treating by 2-ethylanthraquinone. The number of electrodes is 60 on whole piece of device in FIG. 5c.

Atomic Force Microscopy (AFM)

Atomic force microscopy (AFM) is conducted using a MFP 3D microscope (Asylum Research, Santa Barbara, Calif.) with a cantilever (Arrow NC, Nanoworld) in ac mode.

Figure 6:
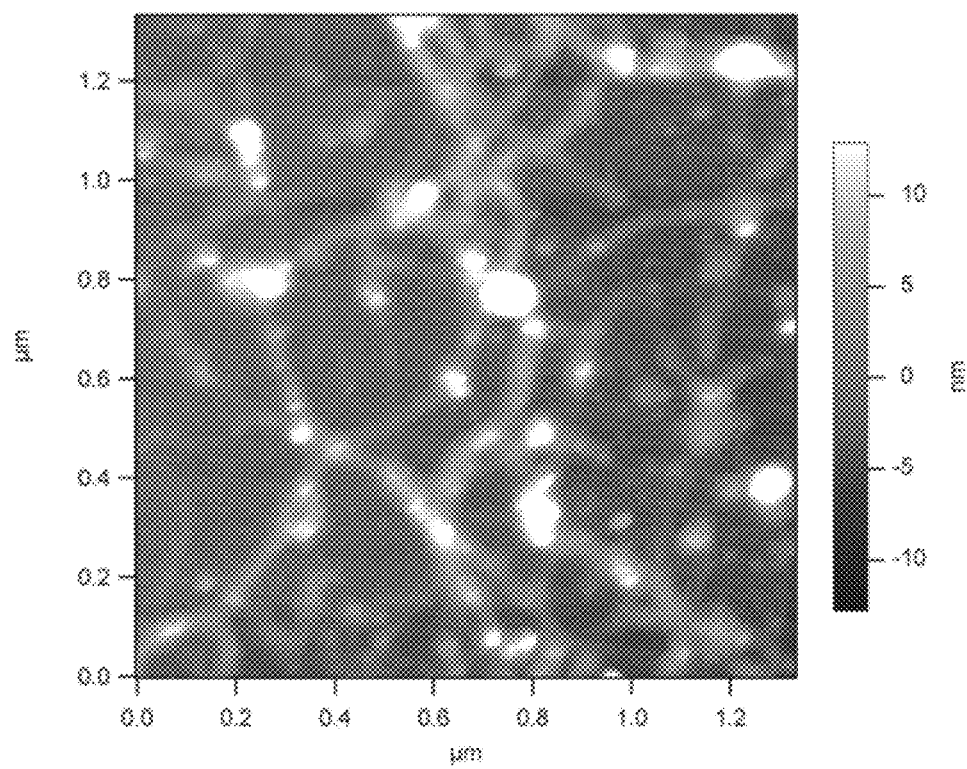
FIG. 6 shows an Atomic Force Microscopy (AFM) image, according to one embodiment.

A $1\times1$ $\mu m^2$ scan of SWNTs networks in the device channel is presented in FIG. 6. The AFM sampling for the network structures on various devices show that the thickness of a thick and film-like layer of SWNTs is about 10 nm. And the SWNTs network density in the channel area is around 10~20 tubes/$\mu m^2$.

Electrical Measurements

All electrical measurements are carried out in ambient conditions using a Keithley semiconductor parameter analyzer, model 4200-SCS.

To confirm the metallic versus semiconducting separation effect of EAQ, electrical properties of pristine and separated fractions of SWNT networks are measured. The electrical resistivities of SWNT networks made from the metallic and semiconducting fractions are, respectively, 191 $\Omega/cm^2$ and 62 216 $S\Omega/cm^2$, which are significantly lower and higher than that of pristine SWNT (1020 $\Omega/cm^2$), corroborating the metallicity-based separation.

Figure 7A:
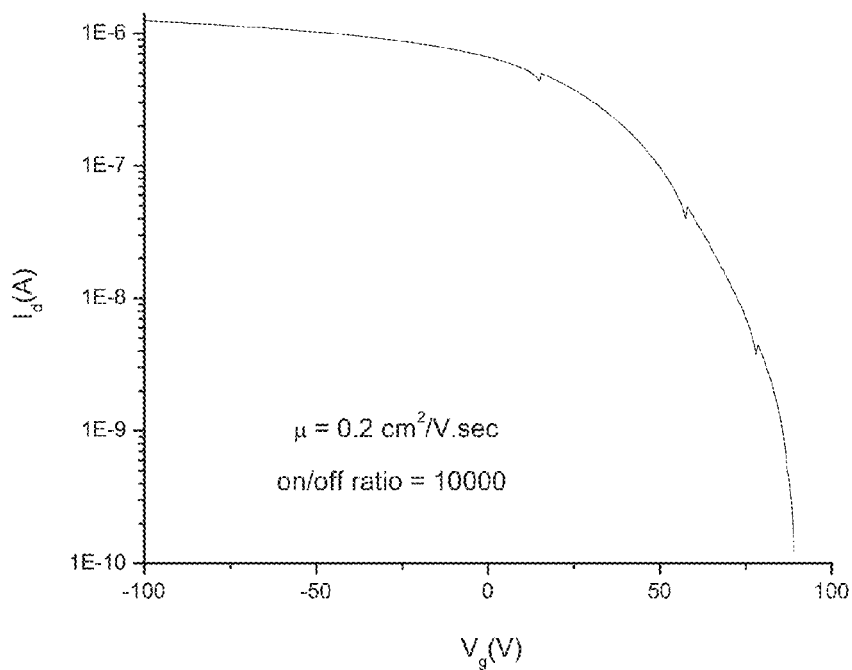
FIG. 7(a) shows a transfer curve, according to one embodiment.
Figure 7B:
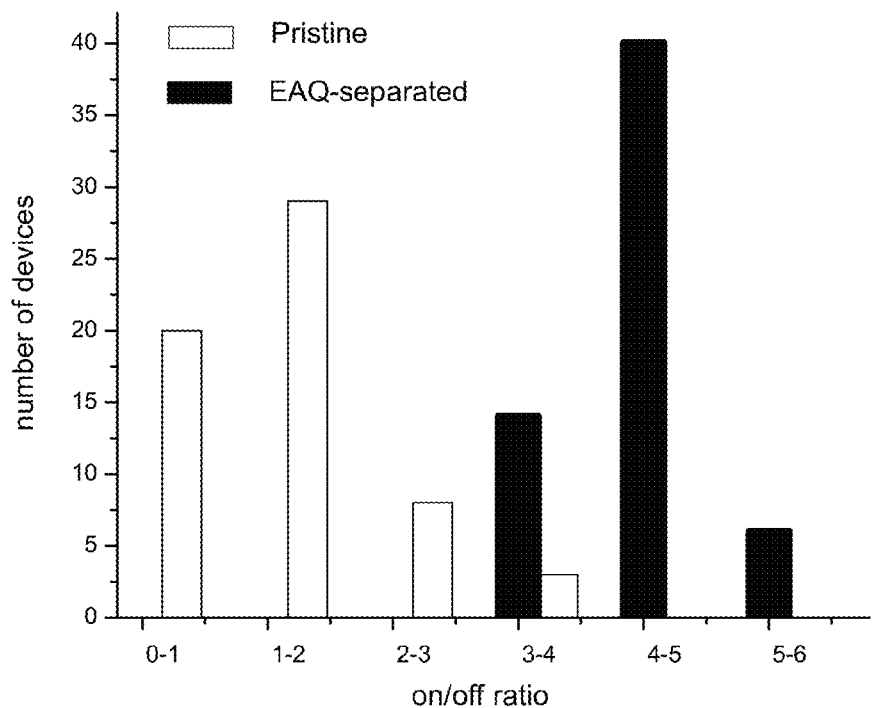
FIGS. 7(b) and 7(c) show histograms, according to various embodiments.
Figure 7C:
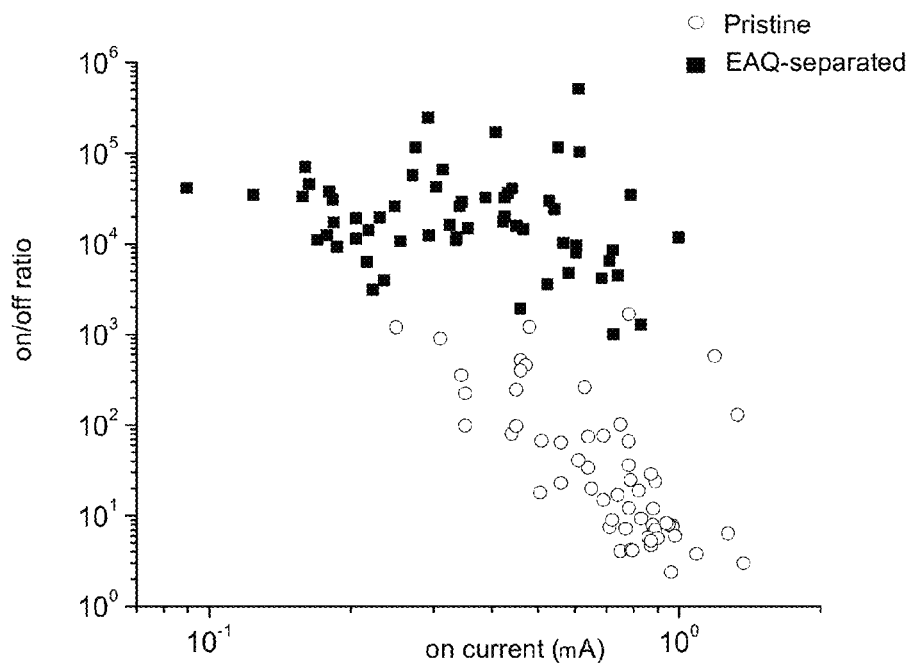

FIG. 7(a) shows the transfer curve of a representative TFTs device with forward and reverse sweeps of drain current ($I_d$) vs. gate voltage ($V_g$). The FET exhibits p-type behavior with on/off ratio of $10^4$. Mobility is estimated to be 0.2 $cm^2$/Vs, which is estimated using the standard formula $\mu=(dI_d/dV_g)/(\in V_d W/L_{ox} L)$, where $L_{ox}$ is the $SiO_2$ thickness, L is the channel length, $\in$ is the dielectric constant of $SiO_2$ (4.0), and W is the channel width. The sample size for each type of SWNT devices is 60. FIG. 7(b) shows a histogram of on/off ratios for devices constructed on same substrate with EAQ-separated SWNTs and with pristine SWNTs. And FIG. 7(c) shows a histogram of on currents for devices constructed on same substrate with EAQ-separated SWNTs and with pristine SWNTs. The on currents for devices constructed from the EAQ-separated SWNTs and pristine SWNTs are mostly from 0.1 µA to 1 µA, which indicate that SWNTs densities on the both devices are almost equivalent. Sixty TFTs are fabricated simultaneously and the numbers of working devices are 60 (100%) for the EAQ-separated SWNTs and the pristine SWNTs. The pristine SWNTs shows a broad distribution of on/off ratios from 5 to 1000, 83% of the TFTs has on/off ratios lower than 100 and none of the TFTs has on/off ratios higher than $10^4$. By contrast, all the on/off ratios of the EAQ-separated SWNTs-TFTs are distributed between $10^3$ and $10^5$, 75% of the TFTs has on/off ratios higher than $10^4$ and none of the TFTs has an on/off ratio lower than $10^3$. From FIG. 7c, it is shown that the on-state current (Ion) versus the on/off ratio for the devices of the EAQ-separated SWNTs and pristine SWNTs, which also indicate that the on/off ratio of the EAQ-separated SWNTs-TFTs is significantly improved (~2 order) than the pristine SWNTs-TFTs. These results demonstrate that the performances of TFTs are greatly enhanced by using EAQ-separated SWNTs without degrading any parameters, which indicate that the separation by EAQ efficiently increases the semiconducting-to-metallic tube ratio.

Density Functional Calculations to Model the Interaction of EAQ

For the computer simulations, all the calculations are performed using generalized gradient approximation Perdew-Burke-Eznerhof (GGA-PBE) method as implemented in Vienna ab initio simulation package (VASP). A 1×1×1 grid for k-point sampling and an energy cutoff of 400 eV are used throughout the calculations. In this calculation, .OH radical are used as the model radical to understand the interaction between EAQ radical and single-walled carbon nanotubes (SWNTs). The bindings with various small and large diameter semiconducting and metallic SWNT species (Table 3) are evaluated.

TABLE 3

Binding energies (in eV) of adsorbants with various SWNT species.

| Type | | Diameter (Å) | Binding Energy (eV) | |
| --- | --- | --- | --- | --- |
| | | | EAQ | •OH |
| (6, 4) | semiconducting | 6.92 | ~0 | −1.40 |
| (6, 5) | semiconducting | 7.56 | ~0 | −1.24 |
| (7, 4) | metallic | 7.63 | ~0 | −1.52 |
| (8, 2) | metallic | 7.27 | ~0 | −1.77 |
| (7, 5) | semiconducting | 8.27 | ~0 | −1.20 |
| (8, 4) | semiconducting | 8.29 | ~0 | −1.27 |
| (10, 1) | metallic | 8.34 | ~0 | −1.54 |

Figure 8:
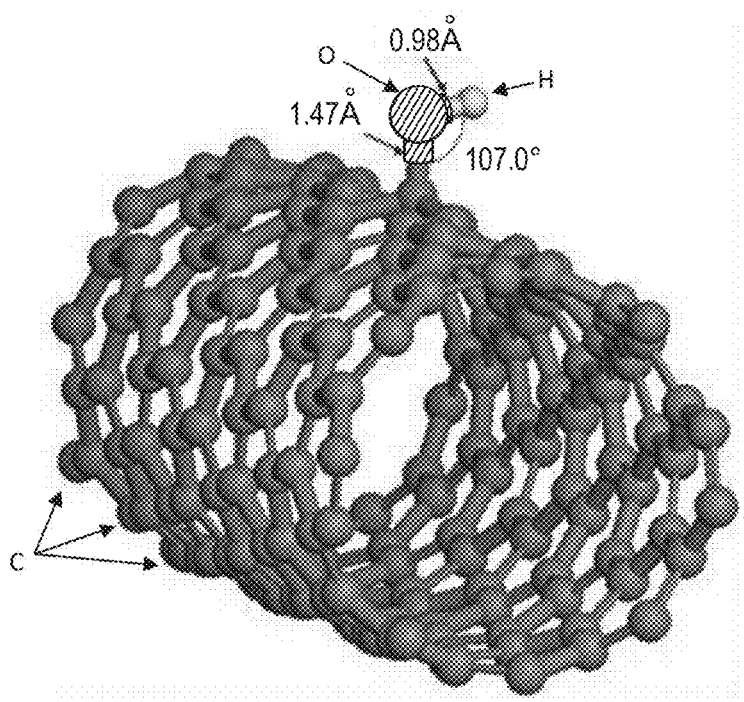
FIG. 8 shows pertinent geometries of .OH radical adsorption, according to one embodiment.

Approximately 40% of a CoMoCAT sample is (6,5) and the semiconducting and metallic species present in CoMoCAT present are approximately in the ratio of 11:1. The most dominant metallic species present is (7,4) which has a fairly small diameter of 0.75 nm, close to that of the dominant (6,5) semiconducting species present. Binding energies with various semiconducting ((6,4), (6,5), (7,5) and (8,4)) and metallic ((8,2), (7,4) and (10,1)) nanotubes are calculated. The (8,2) and (10,1) species are not found in actual CoMo-CAT samples but added to show effect of diameter on metallic nanotube binding in the calculation. The EAQ molecule does not bind to the semiconducting or metallic SWNTs so that the binding energy is zero (see Table 3), which is consistent with the report by Woods et al., *Physical Review B* 2007, 75, 15 that benzene is only physisorbed on SWNT (8,0) with equilibrium distance of ~3.15 Å above the SWNT. However, EAQ can form radicals under UV and from the current density functional calculations, .OH radical are found to interact with all the metallic and semiconducting species with binding energies between −1.77 eV and −1.20 eV, forming single bond between C and O with bond distance of ~1.47 Å (see Table 3 and FIG. 8 showing pertinent geometries of .OH radical adsorption on metallic SWNT (8,2)). It is shown that the active species responsible for the enrichment of semiconducting SWNTs are the radicals from EAQ.

Figure 9:
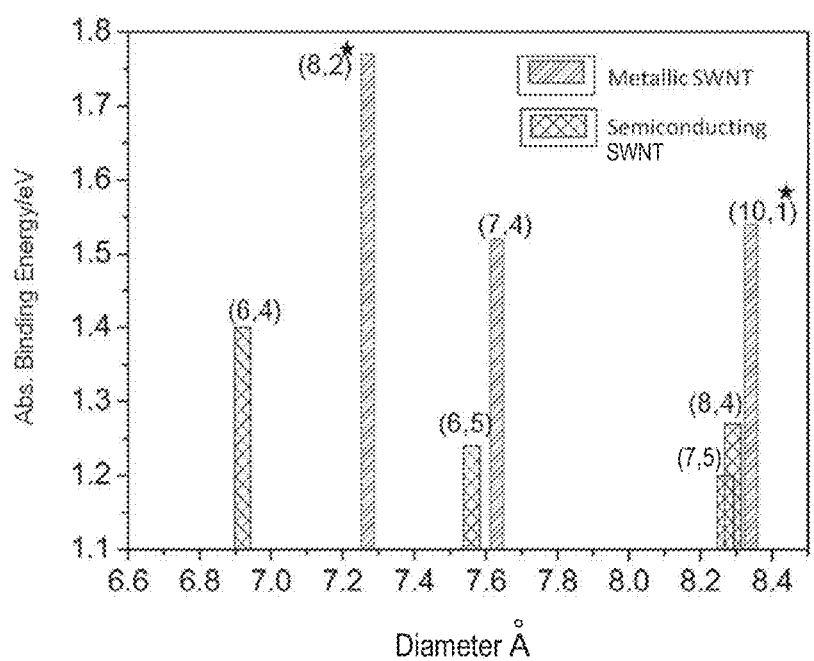
FIG. 9 shows the effect of metallicity and diameter on binding energy with .OH radical, according to various embodiments.

FIG. 9 shows the effect of metallicity and diameter on binding energy with .OH radical (the binding energy is negative but the absolute value is shown) (★: indicates model species for this calculation of the effect of diameter).

From FIG. 9, the binding of .OH radical with metallic nanotubes is shown to be stronger (i.e. more negative) than with semiconducting tubes of similar diameter. For example, (7,4) binds more strongly by −0.28 eV than (6,5) and these two tubes which have about the same diameter (~7.6 Å) are the major metallic and semiconducting nanotubes respectively in this grade of CoMoCAT SWNTs. Further, smaller diameter tubes (both semiconducting and metallic) have stronger interaction with the radical than larger diameter nanotubes of the same metallicity. These trends are consistent with the FET measurement that EAQ preferentially suspends semiconducting nanotubes and reacts with/removes metallic tubes so that better FETs are observed. Raman and UV-vis-NIR data of FIGS. 2i(a) and 1(a) also show the removal of (7,4) species which is a major metallic species of relatively small diameter. However, FIG. 2i(a) also suggests that the larger diameter (8,5) metallic tubes still remain in the SWNT ensemble. Using CoMoCAT SWNTs which have narrow initial chirality range to start with, it is shown that treatment with EAQ in DMF preferentially removes smaller diameter metallic nanotubes, resulting in enrichment in larger diameter semiconducting species.

Example List of Photoinitiators in UV Experiment

For the photoinitiators used or that can be used in the UV experiment, they are classified as follows: —

Free Radical—Type I, such as

| | | |
|---|---|---|
| i) | Irgacure | 184 |
| ii) | Irgacure | 369 |
| iii) | Irgacure | 500 |
| iv) | Irgacure | 819 |
| v) | Irgacure | 907 |
| vi) | Darocur | 1173 | and other Benzoinethers, Benzilketals, alpha-Dialkoxy-aceto-phenones, alpha-hydroxy-alkyl-phenones, alpha-amino-alkyl-phenones, Acyl-phosphine oxides.

Free Radical—Type II, such as
i) Anthraquinone-2-sulfonic acid sodium salt (A2S)
ii) 2-Ethylanthraquinone
iii) 2-Amino anthraquinone
iv) 2-(Hydroxymethyl)anthraquinone
v) Darocur BP
and other Benzophenones/amines, Thioxanthones/amines combinations.

Other electron sources: Phenothiazines and their analogues, N-Bromosuccinimide.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method for enriching specific species of carbon nanotubes, comprising:
   contacting a composition of carbon nanotubes with one or more quinone compounds;
   reacting the carbon nanotubes with the quinone compounds; and
   separating the carbon nanotubes reacted with the quinone compounds from the unreacted carbon nanotubes,
   wherein the one or more quinone compounds are of Formula (I):

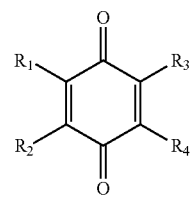

(I)

wherein
$R_1$, $R_2$, $R_3$, and $R_4$ are each independently selected from the group consisting of H, halogen, —CN, —OR, —$N_3$, —C(O)OR, —C(O)R, —C(O)NRR', —NRC(O)R, —NRR', —SOR, —$SO_2$R, —$NO_2$, a substituted or unsubstituted $C_{1-6}$ alkyl group, a substituted or unsubstituted $C_{2-6}$ alkenyl group, and a substituted or unsubstituted $C_{2-6}$ alkynyl group, or
$R_1$ and $R_2$, and/or $R_3$ and $R_4$ combine to form a substituted or unsubstituted ring,
wherein
R and R' are each independently selected from the group consisting of H and $C_{1-6}$ alkyl;
provided that the compound is not 2,3-dichloro-5,6-dicyano-1,4,-benzoquinone or tetrachlorobenzoquinone;
wherein the contacting step comprises suspending the composition of carbon nanotubes in an organic solvent containing the one or more quinone compounds; and
wherein the reacting step comprises incubating the suspension under conditions that allow the quinone compounds to form radicals that react with a specific species of the carbon nanotubes.

2. The method as claimed in claim 1, wherein $R_1$ and $R_2$ and/or $R_3$ and $R_4$ combine to form a substituted or unsubstituted $C_5$-$C_{20}$ aryl ring.

3. The method as claimed in claim 1, wherein $R_1$ and $R_2$ and/or $R_3$ and $R_4$ form a ring moiety of formula

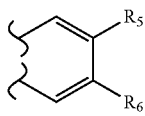

wherein $R_5$ and $R_6$ are each independently selected from the group consisting of H, halogen, —CN, —OR, —$N_3$, —C(O)OR, —C(O)R, —C(O)NRR', —NRC(O)R, —NRR', —SOR, —$SO_2R$, —$NO_2$, a substituted or unsubstituted $C_{1-6}$ alkyl group, a substituted or unsubstituted $C_{2-6}$ alkenyl group, and a substituted or unsubstituted $C_{2-6}$ alkynyl group, wherein
R and R' are each independently selected from the group consisting of H and $C_{1-6}$ alkyl.

4. The method as claimed in claim 3, wherein $R_1$ and $R_2$ combine to form a 6-membered aromatic ring and wherein $R_5$ and $R_6$ are hydrogen.

5. The method as claimed in claim 3, wherein $R_3$ and $R_4$ combine to form a substituted 6-membered aromatic ring, wherein at least one of $R_5$ and $R_6$ is not hydrogen.

6. The method as claimed in claim 1, wherein the one or more quinone compounds is

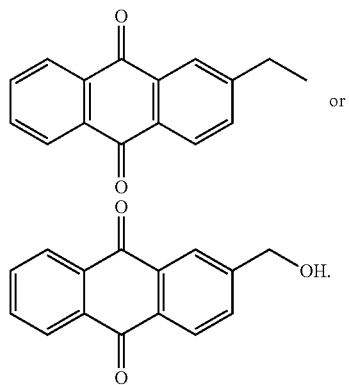

7. The method as claimed in claim 1, wherein the carbon nanotubes are singled-walled carbon nanotubes.

8. The method as claimed in claim 1, wherein the carbon nanotubes are as-produced carbon nanotubes.

9. The method as claimed in claim 1, wherein the carbon nanotubes are a mixture of nanotubes with different electronic properties and/or sizes.

10. The method as claimed in claim 1, wherein the method is to enrich single-walled carbon nanotubes according to (1) their electronic properties and/or (2) their diameter.

11. The method as claimed in claim 10, wherein enrichment according to electronic properties allows to separate metallic single-walled carbon nanotubes from semiconducting single-walled carbon nanotubes.

12. The method as claimed in claim 10, wherein enrichment according to diameter allows to separate single-walled carbon nanotubes having a diameter of below 0.9 nm from single-walled carbon nanotubes having a diameter of equal or above 0.9 nm.

13. The method as claimed in claim 1, wherein the conditions that allow quinone radical formation include the exposure of the suspension to light of a wavelength of 280 to 700 nm.

14. The method as claimed in claim 1, wherein the organic solvent is selected from the group consisting of hexane, heptane, cyclohexane, benzene, pyridine, dichloromethane, chloroform, carbon tetrachloride, carbon disulfide, tetrahydrofuran, dioxane, diethyl ether, diisopropylether, ethylene glycol monobutyl ether, methyl ethyl ketone, methyl isobutyl ketone, acetone, cyclohexanone, ethyl acetate, isobutyl isobutyrate, ethylene glycol diacetate, dimethylformamide, acetonitrile, N,N-dimethyl acetamide, nitromethane, acetonitrile, N-methylpyrrolidone, dimethylsulfoxide water, methanol, ethanol, butyl alcohol and formic acid.

15. The method as claimed in claim 1, wherein the separating step comprises after centrifugating the suspension to separate the different species of carbon nanotubes.

16. The method as claimed in claim 15, wherein the separating step further comprises:
filtering the supernatant obtained after centrifugation to obtain carbon nanotubes enriched with respect to one specific species of carbon nanotubes;
optionally washing the obtained carbon nanotubes with a solvent; and
optionally repeating the filtering and washing steps.

17. The method as claimed in claim 16, wherein the solvent is selected from the group consisting of toluene, hexane, heptane, cyclohexane, benzene, pyridine, dichloromethane, chloroform, carbon tetrachloride, carbon disulfide, tetrahydrofuran, dioxane, diethyl ether, diisopropylether, ethylene glycol monobutyl ether, methyl ethyl ketone, methyl isobutyl ketone, acetone, cyclohexanone, ethyl acetate, isobutyl isobutyrate, ethylene glycol diacetate, dimethylformamide, acetonitrile, N,N-dimethyl acetamide, nitromethane, acetonitrile, N-methylpyrrolidone, dimethylsulfoxide water, methanol, ethanol, butyl alcohol and formic acid.

18. The method as claimed in claim 16, wherein the enriched carbon nanotubes after filtering and washing are dried and re-suspended in a surfactant.

19. The method as claimed in claim 18, wherein the enriched carbon nanotubes comprise an increased proportion of semiconducting single-walled carbon nanotubes compared to the starting mixture of carbon nanotubes.

20. The method as claimed in claim 18, wherein the surfactant is sodium dodecyl sulfate (SDS).

* * * * *